(12) United States Patent
Ok et al.

(10) Patent No.: US 9,564,370 B1
(45) Date of Patent: Feb. 7, 2017

(54) EFFECTIVE DEVICE FORMATION FOR ADVANCED TECHNOLOGY NODES WITH AGGRESSIVE FIN-PITCH SCALING

(71) Applicant: International Business Machines Corporation, Armonk, NY (US)

(72) Inventors: Injo Ok, Loudonville, NY (US); Sanjay C. Mehta, Niskayuna, NY (US); Balasubramanian Pranatharthiharan, Waterliet, NY (US); Soon-Cheon Seo, Glenmont, NY (US); Charan V. Surisetty, Clifton Park, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/887,538

(22) Filed: Oct. 20, 2015

(51) Int. Cl.
| | | |
|---|---|---|
| *H01L 21/00* | (2006.01) |
| *H01L 27/00* | (2006.01) |
| *H01L 29/00* | (2006.01) |
| *H01L 21/8234* | (2006.01) |
| *H01L 29/78* | (2006.01) |
| *H01L 29/423* | (2006.01) |
| *H01L 29/51* | (2006.01) |
| *H01L 29/66* | (2006.01) |
| *H01L 21/283* | (2006.01) |
| *H01L 21/311* | (2006.01) |
| *H01L 27/088* | (2006.01) |

(52) U.S. Cl.
CPC ..... *H01L 21/823468* (2013.01); *H01L 21/283* (2013.01); *H01L 21/31111* (2013.01); *H01L 21/823431* (2013.01); *H01L 21/823462* (2013.01); *H01L 27/0886* (2013.01); *H01L 29/42356* (2013.01); *H01L 29/42364* (2013.01); *H01L 29/513* (2013.01); *H01L 29/66553* (2013.01); *H01L 29/66795* (2013.01); *H01L 29/785* (2013.01)

(58) Field of Classification Search
CPC ............ H01L 21/823468; H01L 21/823462; H01L 21/31111; H01L 21/823431; H01L 27/0886; H01L 27/10879; H01L 27/10826; H01L 29/513; H01L 29/42364; H01L 29/66795; H01L 29/42356; H01L 29/785
See application file for complete search history.

(56) References Cited

U.S. PATENT DOCUMENTS

| | | |
|---|---|---|
| 6,709,982 B1 | 3/2004 | Buynoski et al. |
| 7,476,578 B1 | 1/2009 | Cheng et al. |

(Continued)

FOREIGN PATENT DOCUMENTS

WO 2004/059727 A1 7/2004

*Primary Examiner* — Nikolay Yushin
(74) *Attorney, Agent, or Firm* — Scully, Scott, Murphy & Presser, P.C.; Steven J. Meyers

(57) ABSTRACT

After forming a gate stack straddling a portion of each semiconductor fin of a plurality of semiconductor fins located over a substrate, a gate liner is formed on sidewalls of a lower portion of the gate stack that contacts the plurality of semiconductor fins and a gate spacer having a width greater than a width of the gate liner is formed on sidewalls of an upper portion of the gate stack that is located above the plurality of semiconductor fins. The width of the gate spacer thus is not limited by the fin pitch, and can be optimized to improve the device performance.

10 Claims, 18 Drawing Sheets

(56) References Cited

U.S. PATENT DOCUMENTS

| | | | |
|---|---|---|---|
| 8,053,838 B2* | 11/2011 | Chen | H01L 29/66795 257/347 |
| 8,310,013 B2* | 11/2012 | Lin | H01L 29/045 257/401 |
| 8,981,496 B2* | 3/2015 | Liu | H01L 21/28008 257/407 |
| 2006/0154423 A1 | 7/2006 | Fried et al. | |
| 2009/0321828 A1* | 12/2009 | Chen | H01L 29/66795 257/347 |
| 2011/0193141 A1* | 8/2011 | Lin | H01L 29/045 257/255 |
| 2014/0264604 A1 | 9/2014 | Tsai et al. | |

* cited by examiner

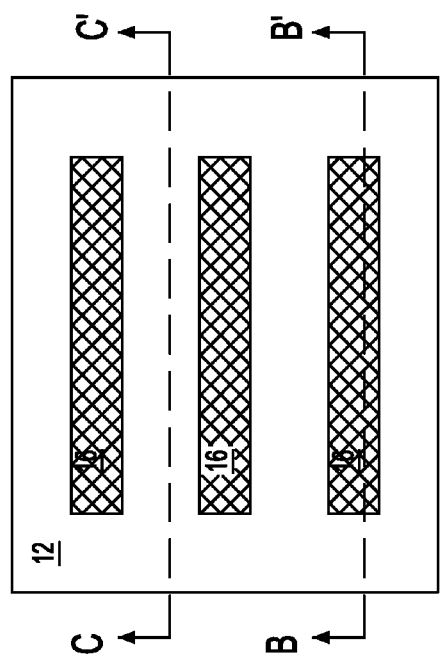
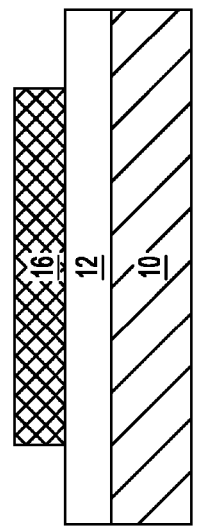
FIG. 1C
FIG. 1A
FIG. 1B

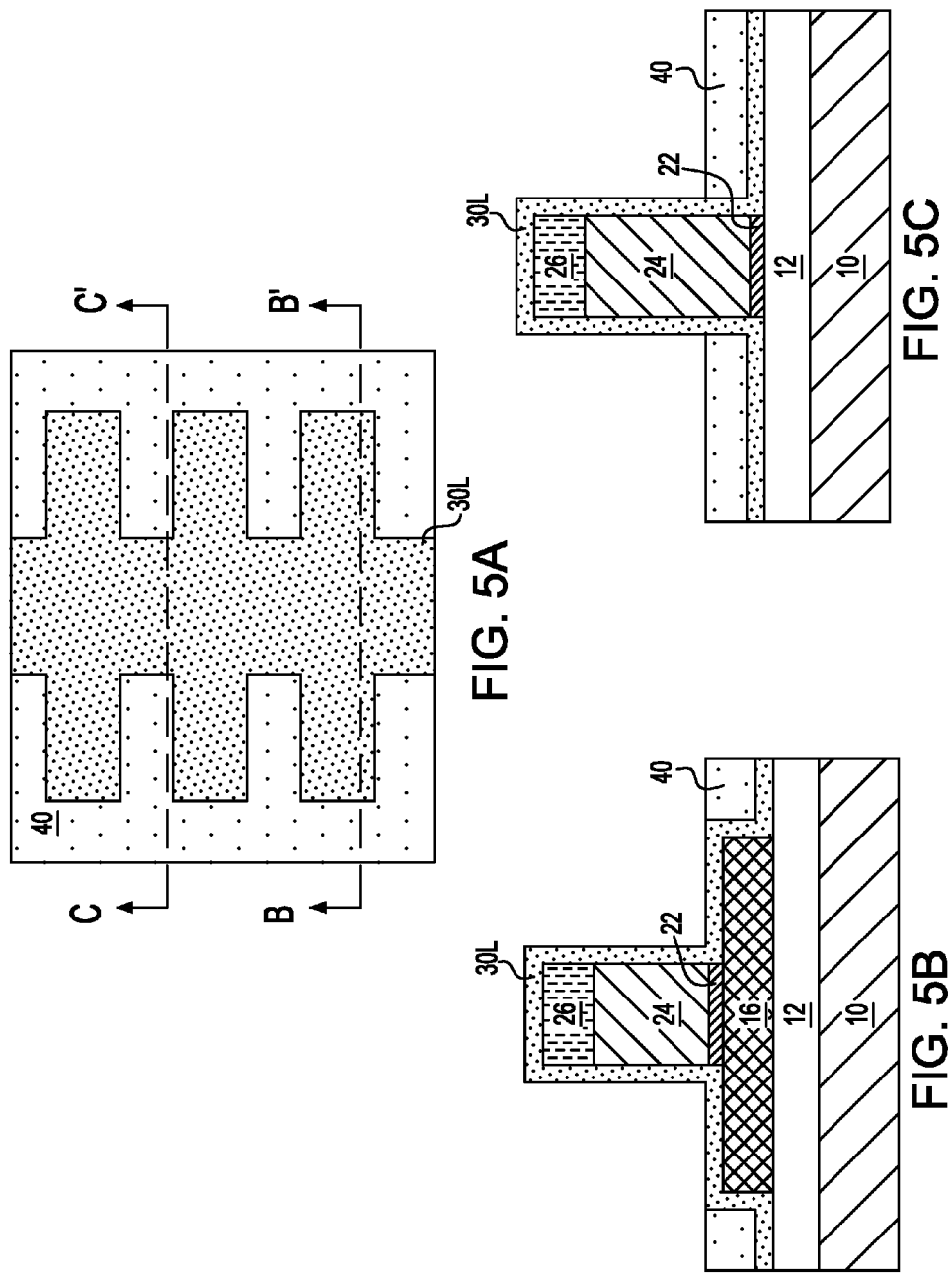

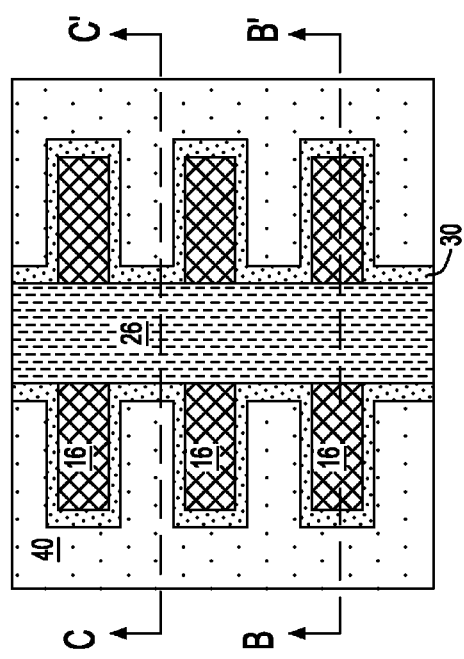
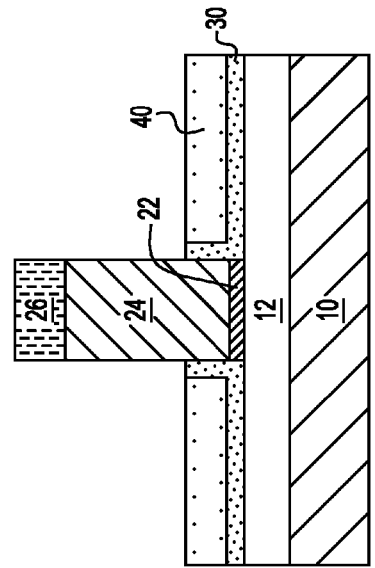
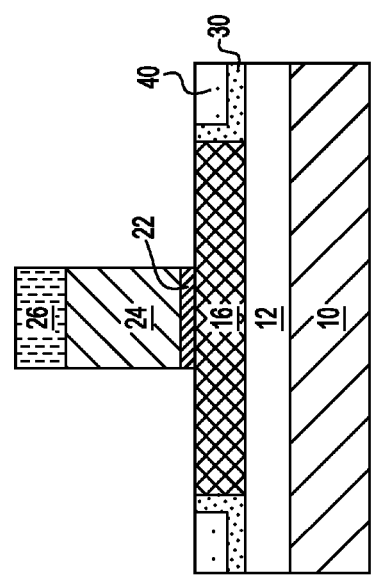
FIG. 6A
FIG. 6B
FIG. 6C

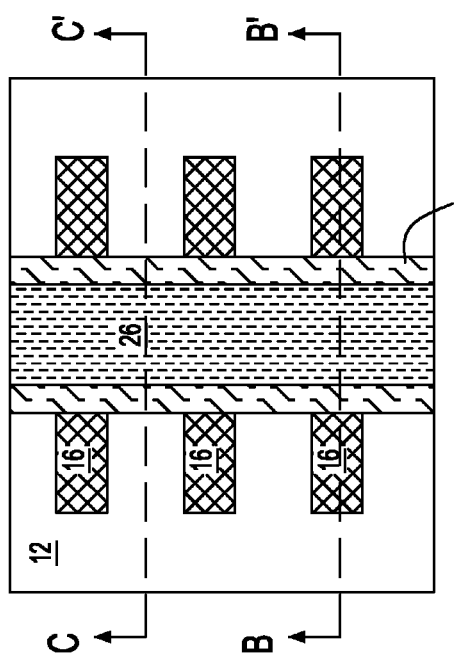
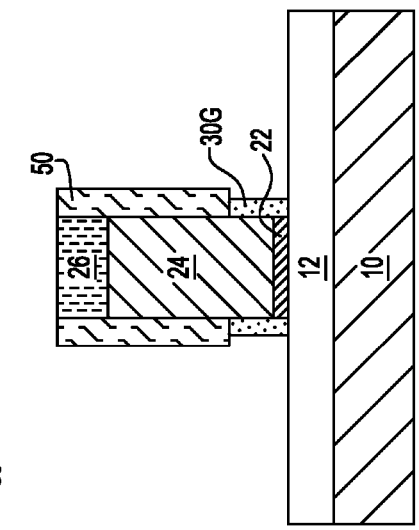
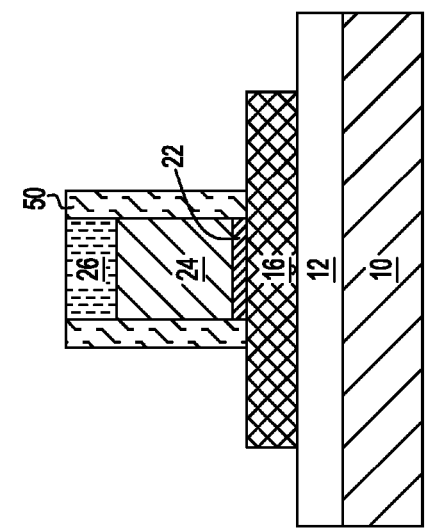
FIG. 9A
FIG. 9B
FIG. 9C

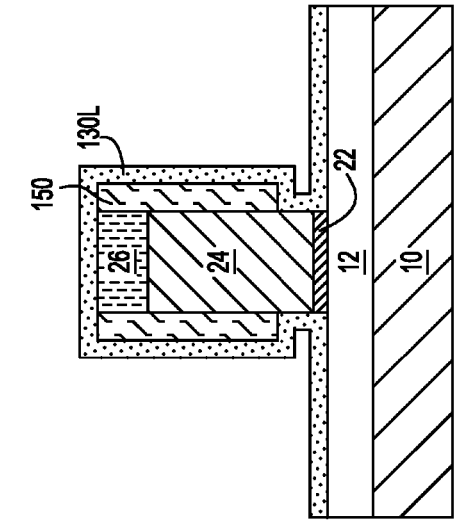
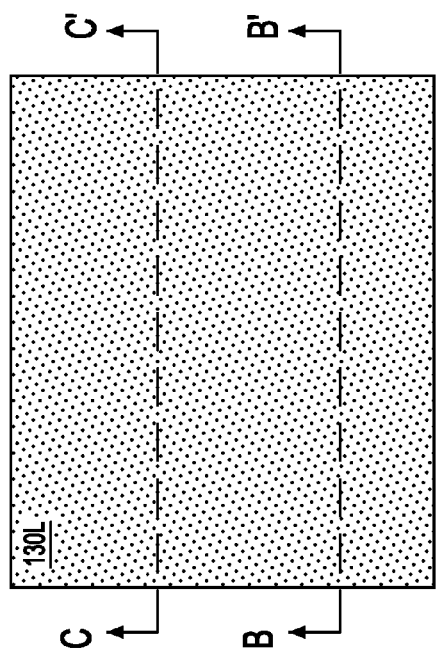
FIG. 16A
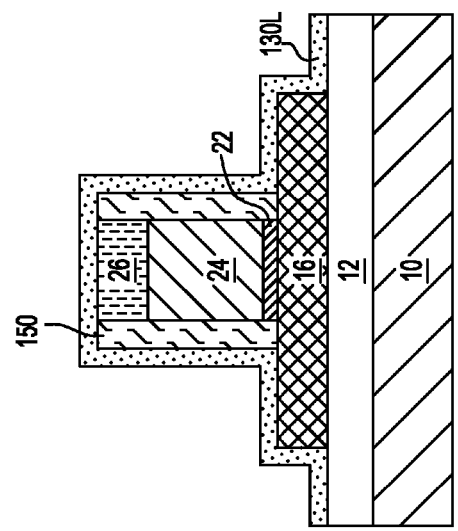
FIG. 16B
FIG. 16C

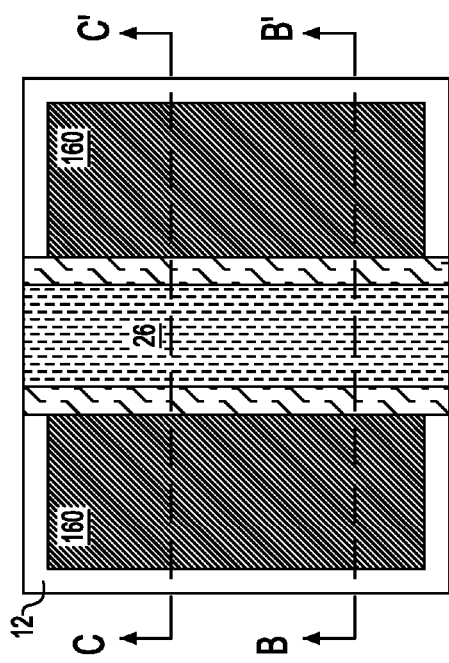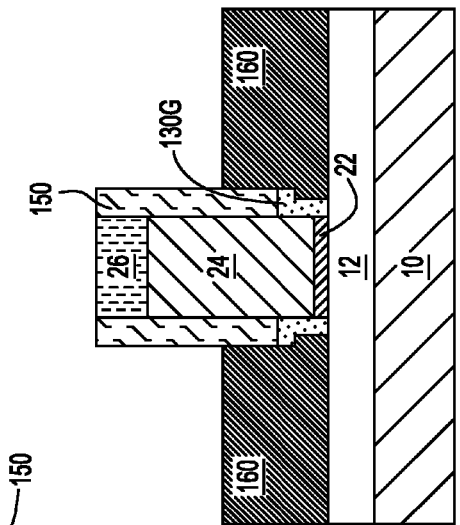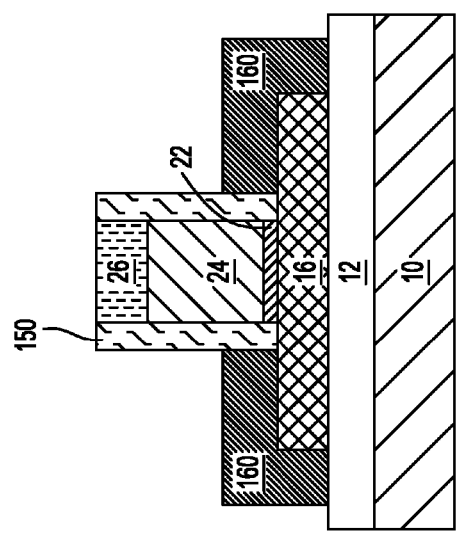

EFFECTIVE DEVICE FORMATION FOR ADVANCED TECHNOLOGY NODES WITH AGGRESSIVE FIN-PITCH SCALING

BACKGROUND

The present application relates to semiconductor device fabrication, and more particularly to fabrication of gate spacers for fin field effect transistors (FinFETs) with tighter fin pitches.

FinFETs are a desired device architecture due to their fast switching times and high current densities. In its basic form, a FinFET includes a source region, a drain region and fin-shaped channels located between the source and the drain regions. A gate electrode formed over the fins regulates electron flow between the source and the drain regions. A gate spacer is typically formed on sidewalls of the gate electrode to control gate-to-source/drain spacing. Devices with a narrow spacer width exhibit better performance (drive current) because of a lower series resistance. However, devices with a larger spacer width are better for short channel effect (SCE) control. The spacer width thus needs to be optimized for performance and SCE control.

The spacer width optimization in FinFETs becomes increasingly challenging as the fin pitches are scaling down. As the fin pitch decreases, a gate spacer layer from which the gate spacer is formed can merge neighboring fins, which makes the complete removal of the spacer material from the spaces between the fins difficult. Any remaining spacer material between fins can block the formation of the source and drain regions, killing yield. Therefore, there remains a need to develop a novel gate spacer structure that allows optimization of the spacer width to improve performance of FinFETs with tighter fin pitches.

SUMMARY

The present application provides a gate spacer structure that allows optimization of the spacer width to improve performance of FinFETs with tighter fin pitches. After forming a gate stack straddling a portion of each semiconductor fin of a plurality of semiconductor fins located over a substrate, a gate liner is formed on sidewalls of a lower portion of the gate stack that contacts the plurality of semiconductor fins and a gate spacer having a width greater than a width of the gate liner is formed on sidewalls of an upper portion of the gate stack that is located above the plurality of semiconductor fins. The width of the gate spacer thus is not limited by the fin pitch, and can be optimized to improve the device performance.

In one aspect of the present application, a semiconductor structure is provided. The semiconductor structure includes a plurality of semiconductor fins located over a substrate, a gate stack straddling a portion of each of the plurality of semiconductor fins, a gate liner laterally surrounding a lower portion of the gate stack that contacts the plurality of semiconductor fins, and a gate spacer present atop the gate liner and laterally surrounding an upper portion of the gate stack that locates above the plurality of semiconductor fins.

In another aspect of the present application, a method of forming a semiconductor structure is provided.

In one embodiment, the method includes forming a gate stack over a portion of each of a plurality of semiconductor fins located on a substrate. A dielectric liner layer is then formed over exposed surfaces of the gate stack, the plurality of semiconductor fins and the substrate. After forming a sacrificial dielectric portion filling spaces between the plurality of semiconductor fins, a portion of the dielectric liner layer is removed from an upper portion of the gate stack that is located above the plurality of semiconductor fins to provide a dielectric liner. The dielectric liner laterally surrounds a lower portion of the gate stack that contacts the plurality of the semiconductor fins. Next, a gate spacer is formed to laterally surround an upper portion of the gate stack that is located above the plurality of the semiconductor fins. After removing the sacrificial dielectric portion, portions of the dielectric liner that are not covered by the gate spacer are removed from sidewalls of the plurality of semiconductor fins and a top surface of the substrate.

In another embodiment, the method includes forming a gate stack over a portion of each of a plurality of semiconductor fins located on a substrate. A sacrificial dielectric portion is then formed to fill spaces between the plurality of semiconductor fins. The sacrificial dielectric portion laterally surrounds a lower portion of the gate stack. Next, a gate spacer is formed on sidewalls of an upper portion of the gate stack that is not covered by the sacrificial dielectric portion. After removing the sacrificial dielectric portion to expose sidewalls of the lower portion of the gate stack, a gate liner is formed on the exposed sidewalls of the lower portion of the gate stack.

BRIEF DESCRIPTION OF THE DRAWINGS

FIG. 1A is a top-down view of a first exemplary semiconductor structure including a plurality of semiconductor fins located on a substrate according to a first embodiment of the present application.

FIG. 1B is a cross-sectional view of the first exemplary semiconductor structure of FIG. 1A along line B-B'.

FIG. 1C is a cross-sectional view of the first exemplary semiconductor structure of FIG. 1A along line C-C'.

FIG. 5A is a top-down view of the first exemplary semiconductor structure of FIGS. 4A-4C after forming a sacrificial dielectric portion filling spaces between the semiconductor fins.

FIG. 5B is a cross-sectional view of the first exemplary semiconductor structure of FIG. 5A along line B-B'.

FIG. 5C is a cross-sectional view of the first exemplary semiconductor structure of FIG. 5A along line C-C'.

FIG. 6A is a top-down view of the first exemplary semiconductor structure of FIGS. 5A-5C after removing portions of the dielectric liner layer that are not covered by the sacrificial dielectric portion to provide a dielectric liner.

FIG. 6B is a cross-sectional view of the first exemplary semiconductor structure of FIG. 6A along line B-B'.

FIG. 6C is a cross-sectional view of the first exemplary semiconductor structure of FIG. 6A along line C-C'.

FIG. 9A is a top-down view of the first exemplary semiconductor structure of FIGS. 8A-8C after removing portions of the dielectric liner that are not covered by the gate spacer to provide a gate liner present on sidewalls of a lower portion of the gate stack that contacts the semiconductor fins.

FIG. 9B is a cross-sectional view of the first exemplary semiconductor structure of FIG. 9A along line B-B'.

FIG. 9C is a cross-sectional view of the first exemplary semiconductor structure of FIG. 9A along line C-C'.

FIG. 16A is a top-down view of the second exemplary semiconductor structure of FIGS. 15A-15C after forming a dielectric liner layer over exposed surfaces of the substrate, the semiconductor fins, the gate stack and the gate spacer.

FIG. 16B is a cross-sectional view of the second exemplary semiconductor structure of FIG. 16A along line B-B'.

FIG. 16C is a cross-sectional view of the second exemplary semiconductor structure of FIG. 16A along line C-C'.

FIG. 18A is a top-down view of the second exemplary semiconductor structure of FIGS. 17A-17C after forming a source drain and a drain region over portions of the semiconductor fins located on opposite sides of a stack of the gate liner and the gate spacer.

FIG. 18B is a cross-sectional view of the second exemplary semiconductor structure of FIG. 18A along line B-B'.

FIG. 18C is a cross-sectional view of the second exemplary semiconductor structure of FIG. 18A along line C-C'.

DETAILED DESCRIPTION

Figure 2A:
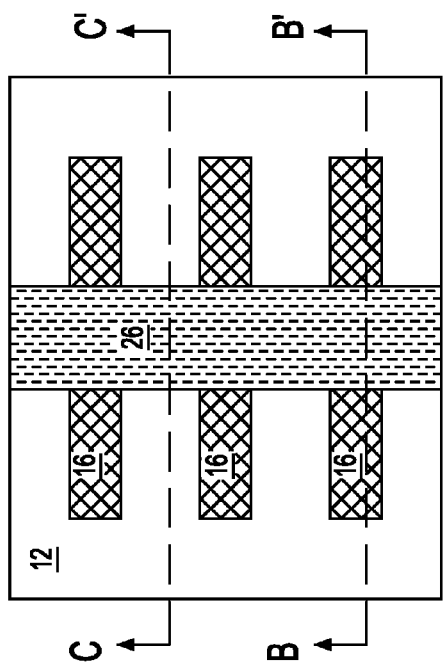
FIG. 2A is a top-down view of the first exemplary semiconductor structure of FIGS. 1A-1C after forming a gate stack straddling a portion of each of the semiconductor fins.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

Referring to FIGS. 1A-1C, a first exemplary semiconductor structure that can be employed in a first embodiment of the present application includes a plurality of semiconductor fins 16 located on a substrate. Each semiconductor fin 16 can have a rectangular horizontal cross-sectional area. The width of each semiconductor fin can be from 5 nm to 100 nm, although lesser and greater widths can also be employed. The height of each semiconductor fin can be from 10 nm to 200 nm, although lesser and greater heights can also be employed. Adjacent semiconductor fins 16 may be separated by a pitch ranging from 20 nm to 100 nm. In one embodiment, the adjacent semiconductor fins 16 are separated by a pitch ranging from 30 nm to 50 nm.

In one embodiment, the semiconductor fins 16 can be formed by providing a semiconductor-on-insulator (SOI) substrate including a vertical stack, from bottom to top, a handle substrate 10, a buried insulator layer 12 and a top semiconductor layer (not shown) from which the semiconductor fins 16 are formed.

The handle substrate 10 may include a semiconductor material such as, for example, silicon (Si), silicon germanium (SiGe), silicon germanium carbide (SiGeC), silicon carbide (SiC), an III-V compound semiconductor, an II-VI compound semiconductor, or any combinations thereof. Multilayers of semiconductor materials can also be used as the semiconductor material of the handle substrate 10. In one embodiment, the handle substrate 10 is composed of single crystalline silicon. The thickness of the handle substrate 10 can be from 50 µm to 2 mm, although lesser and greater thicknesses can also be employed.

The buried insulator layer 12 may include a dielectric material such as, for example, silicon oxide, silicon nitride, silicon oxynitride, boron nitride or a combination thereof. In one embodiment, the buried insulator layer 12 may be formed by a conventional deposition process such as, for example, chemical vapor deposition (CVD) or physically vapor deposition (PVD). In another embodiment, the buried insulator layer 12 may be formed using a thermal growth process, such as thermal oxidation or thermal nitridation, to convert a surface portion of the handle substrate 10 to a dielectric material. The thickness of the buried insulator layer 12 that is formed can be from 50 nm to 200 nm, although lesser or greater thicknesses can also be employed.

The top semiconductor layer may include any semiconductor material as mentioned above for the handle substrate 10. Exemplary semiconductor materials that can be employed as the top semiconductor layer include, but are not limited to, Si, Ge, SiGe, SiC and SiGeC, and III/V compound semiconductors such as, for example, InAs, GaAs, and InP. The semiconductor materials of the top semiconductor layer and the handle substrate 10 may be the same or different. In one embodiment, the top semiconductor layer includes a single crystalline semiconductor material such as, for example, single crystalline silicon. The top semiconductor layer may be doped with a dopant of a first conductivity type, which can be p-type or n-type. In one embodiment, the dopant may be a p-type dopant including, but not limited to, boron (B), aluminum (Al), gallium (Ga), and indium (In). In another embodiment, the dopant may be an n-type dopant including, but not limited to, antimony (Sb), arsenic (As), and phosphorous (P). The dopant concentration in the top semiconductor layer can range from $1 \times 10^{18}$ atoms/cm$^3$ to $5 \times 10^{21}$ atoms/cm$^3$, although lesser and greater dopant concentrations can also be employed.

The top semiconductor layer can be provided as an intrinsic single crystalline semiconductor layer and is subsequently doped with a dopant of the first conductivity type, or can be provided as a doped single crystalline semiconductor layer with a dopant of the first conductivity type. The top semiconductor layer can be formed by a deposition process, such as CVD or plasma enhanced chemical vapor deposition (PECVD). The top semiconductor layer that is formed may have a thickness from 20 nm to 600 nm, although lesser or greater thicknesses can also be employed. Alternatively, the top semiconductor layer may be formed using a smart cut process where two semiconductor wafers are bonded together with an insulator in between.

The semiconductor fins 16 can be formed by lithography and etching of the top semiconductor layer of the SOI substrate. The lithographic step includes applying a photoresist layer (not shown) atop the top semiconductor layer, exposing the photoresist layer to a desired pattern of radiation, and developing the exposed photoresist layer utilizing a conventional resist developer. The etching process may comprise a dry etch such as reactive ion etching (RIE), a wet etch or a combination thereof. The etching process transfers the pattern from the patterned photoresist layer to the top semiconductor layer utilizing the buried insulator layer 12 as an etch stop. After transferring the pattern into the top semiconductor layer, the patterned photoresist layer can be removed utilizing a conventional resist stripping process such as, for example, ashing. The remaining portion of the top semiconductor layer after the lithographic patterning constitutes the semiconductor fins 16. Alternatively, the semiconductor fins 16 can also be formed utilizing a sidewall image transfer (SIT) process. In a typical SIT process, spacers are formed on a sacrificial mandrel. The sacrificial mandrel is removed and the remaining spacers are used as a hard mask to etch the top semiconductor layer. The spacers are then removed after the semiconductor fins 16 have been formed.

In another embodiment, the semiconductor fins 16 can be formed by patterning an upper portion of a bulk semiconductor substrate (not shown). An isolation oxide is deposited in the trenches etched between semiconductor fins (not shown), and then etched back to expose some portion of the semiconductor fins, thus defining the baseline of active fin height.

Figure 2C:
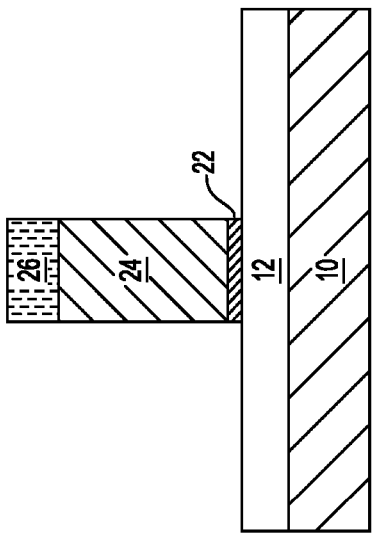
FIG. 2C is a cross-sectional view of the first exemplary semiconductor structure of FIG. 2A along line C-C'.
Figure 2B:
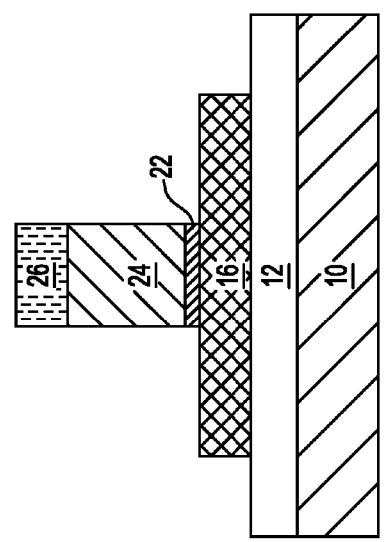
FIG. 2B is a cross-sectional view of the first exemplary semiconductor structure of FIG. 2A along line B-B'.

Referring to FIGS. 2A-2C, a gate stack is formed straddling a portion of each of the semiconductor fins 16. The gate stack includes, from bottom to top, a gate dielectric 22, a gate electrode 24 and a gate cap 26.

The gate stack (22, 24, 26) can be formed by first providing a material stack (not shown) that includes, from bottom to top, a gate dielectric layer, a gate electrode layer and a gate cap layer.

The gate dielectric layer is conformally deposited on exposed surfaces of the semiconductor fins 16. The gate dielectric layer can include a high dielectric constant (high-k) dielectric material having a dielectric constant greater than 8.0 and/or a conventional gate dielectric material such as silicon oxide, silicon nitride, and/or silicon oxynitride. Examples of high-k dielectric material include, but are not limited to, $HfO_2$, $ZrO_2$, $La2O_3$, $Al_2O_3$, $TiO_2$, $SrTiO_3$, $LaAlO_3$, $Y2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Each value of x is independently from 0.5 to 3 and each value of y is independently from 0 to 2.

The gate dielectric layer can be formed by conversion of surface portions of the semiconductor material in the semiconductor fins 16 into a dielectric material such as a dielectric oxide, a dielectric nitride, and/or a dielectric oxynitride. Alternately or additionally, the gate dielectric layer can be formed by conformal deposition of a dielectric material such as a metallic oxide, a metallic nitride, and/or a metallic oxynitride. The conversion of surface portions of the semiconductor material into a dielectric material can be performed, for example, by thermal oxidation, thermal nitridation, plasma oxidation, and/or plasma nitridation. The deposition of a dielectric material can be performed, for example, by atomic layer deposition (ALD) or CVD. The gate dielectric layer that is formed can have a thickness from 0.9 nm to 6 nm, although lesser and greater thicknesses can also be employed.

The gate electrode layer is deposited over the gate dielectric layer. The gate electrode layer can include a conductive material, which can be a doped semiconductor material, a metallic material, or a combination thereof. The doped semiconductor material can be doped polysilicon, doped polycrystalline germanium, a doped silicon-germanium alloy, any other doped elemental or compound semiconductor material, or a combination thereof. The metallic material can be any metallic material that can be deposited by CVD, PVD, or a combination thereof. For example, the metallic material can include aluminum and/or tungsten. The thickness of the gate electrode layer can be from 100 nm to 500 nm, although lesser and greater thicknesses can also be employed.

The gate cap layer may include a dielectric material such as an oxide, a nitride or an oxynitride. In one embodiment, the gate cap layer is comprised of silicon nitride. The gate cap layer can be formed utilizing a conventional deposition process including, for example, CVD and PECVD. The gate cap layer that is formed may have a thickness from 10 nm to 200 nm, although lesser and greater thicknesses can also be employed.

The material stack can then be patterned by lithography and etching to form the gate stack (22, 24, 26). Specifically, a photoresist layer (not shown) is applied over the topmost surface of the material stack and is lithographically patterned by lithographic exposure and development. The pattern in the photoresist layer is transferred into the material stack by an anisotropic etch which can be a dry etch such as RIE or a wet etch. The remaining portion of the material stack after the pattern transfer constitutes the gate stack (22, 24, 26). The remaining portion of the photoresist layer may be subsequently removed by, for example, ashing.

Figure 3A:
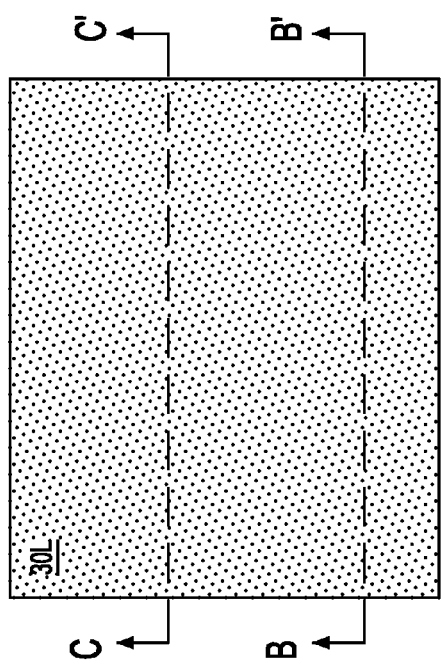
FIG. 3A is a top-down view of the first exemplary semiconductor structure of FIGS. 2A-2C after forming a dielectric liner layer on exposed surfaces of the substrate, the semiconductor fins and the gate stack.
Figure 3C:
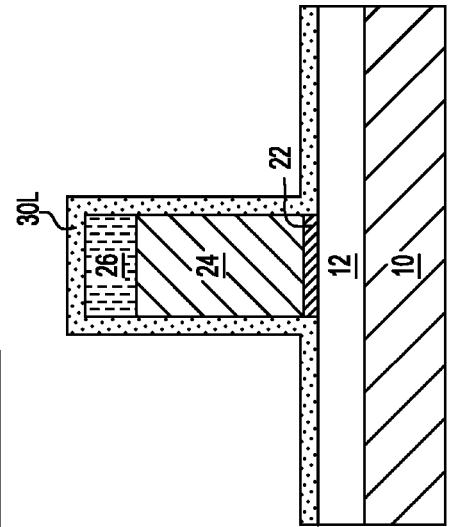
FIG. 3C is a cross-sectional view of the first exemplary semiconductor structure of FIG. 3A along line C-C'.
Figure 3B:
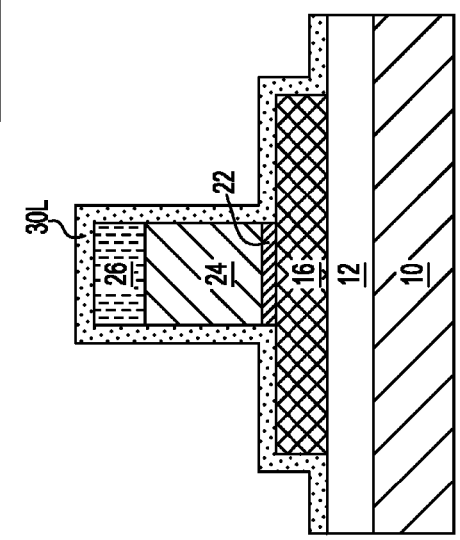
FIG. 3B is a cross-sectional view of the first exemplary semiconductor structure of FIG. 3A along line B-B'.

Referring to FIGS. 3A-3C, a dielectric liner layer 30L is formed as a contiguous layer on exposed surfaces of the buried insulator layer 12, the semiconductor fins 16 and the gate stack (22, 24, 26). The dielectric liner layer 30L may be formed of a material that would give high selectivity to a flowable oxide employed in a sacrificial dielectric layer subsequently formed. In one embodiment, the dielectric liner layer 30L includes silicoboron carbonitride (SiBCN), silicon nitride ($Si_3N_4$), or silicon oxycarbonitride (SiOCN). The dielectric liner layer 30L may be conformally deposited using conventional deposition techniques such as, for example, ALD, molecular layer deposition (MLD), or CVD. The dielectric liner layer 30L may have a thickness ranging from 1 nm to 5 nm, although lesser and greater thicknesses can also be employed.

Figure 4A:
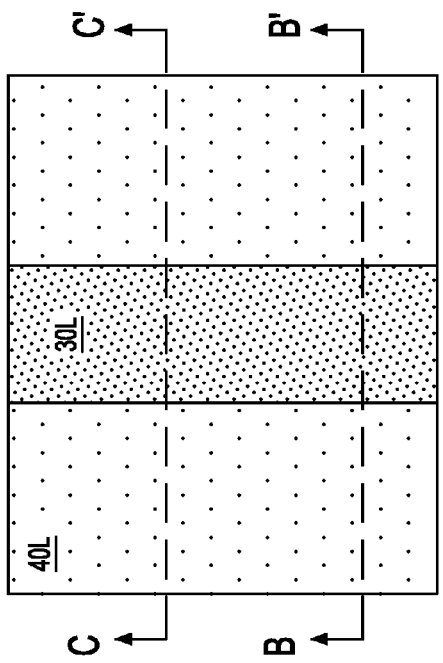
FIG. 4A is a top-down view of the first exemplary semiconductor structure of FIGS. 3A-3C after forming a sacrificial dielectric layer on top of the dielectric liner layer.
Figure 4C:
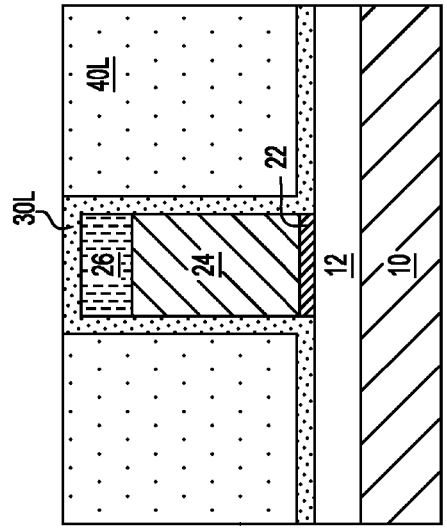
FIG. 4C is a cross-sectional view of the first exemplary semiconductor structure of FIG. 4A along line C-C'.
Figure 4B:
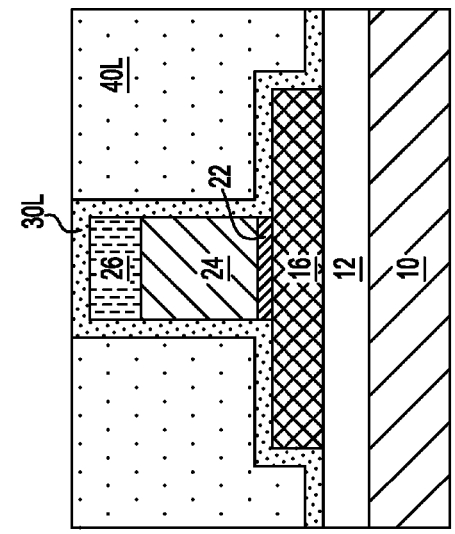
FIG. 4B is a cross-sectional view of the first exemplary semiconductor structure of FIG. 4A along line B-B'.

Referring to FIGS. 4A-4C, a sacrificial dielectric layer 40L is deposited on top of the dielectric liner layer 30L. The sacrificial dielectric layer 40L may include a flowable oxide or spin-on glass. For example, the sacrificial dielectric layer 40L may be formed of hydrogen silsesquioxane (HSQ) or a carbon doped silicon oxide. The sacrificial dielectric layer 40L can be deposited by CVD or spin coating. The sacrificial dielectric layer 40L is deposited to a thickness such that a top surface of the sacrificial dielectric layer 40L is located above the topmost surface of the dielectric liner layer 30L. Following the deposition, the sacrificial dielectric layer 40L can be subsequently planarized by a planarization process such as, for example, chemical mechanical planarization (CMP), a recess etch, or a combination thereof. The top surface of the sacrificial dielectric layer 40L thus is coplanar with the topmost surface of the dielectric liner layer 30L.

Referring FIGS. 5A-5C, the sacrificial dielectric layer 40L is recessed employing the dielectric liner layer 30L as an etch stop, thus exposing portions of the dielectric liner layer 30 that are present on sidewalls of an upper portion of the gate stack (22, 24, 26) located above the semiconductor fins 16. An etch back process can be performed to remove the dielectric material of the sacrificial dielectric layer 40L selective to the dielectric material of the dielectric liner layer 30L. The etch back process can be a dry etch such as, for example RIE or a wet etch employing diluted hydrofluoric acid (DHF). The remaining portion of the sacrificial dielectric layer 40L is herein referred to as a sacrificial dielectric portion 40. The sacrificial dielectric portion 40 completely fills the spaces between semiconductor fins 16 and has a top surface coplanar with the top surfaces of the horizontal portions of the dielectric liner layer 30L that are located on top of the semiconductor fins 16.

Referring to FIGS. 6A-6C, exposed portions of the dielectric liner layer 30L are removed from the sidewalls of the gate stack (22, 24, 26) and top surfaces of the semiconductor fins 16, for example, by an isotropic etch. The isotropic etch can be a dry etch or a wet etch employing phosphoric acid. Portions of the dielectric liner layer 30L that are present on the sidewalls of the semiconductor fins 16 and the top surface the buried insulator layer 12 remain covered by the sacrificial dielectric portion 40, and are thus unaffected by this isotropic etch. The remaining portions of the dielectric liner layer 30L are herein referred to as the dielectric liner 30.

Figure 7A:
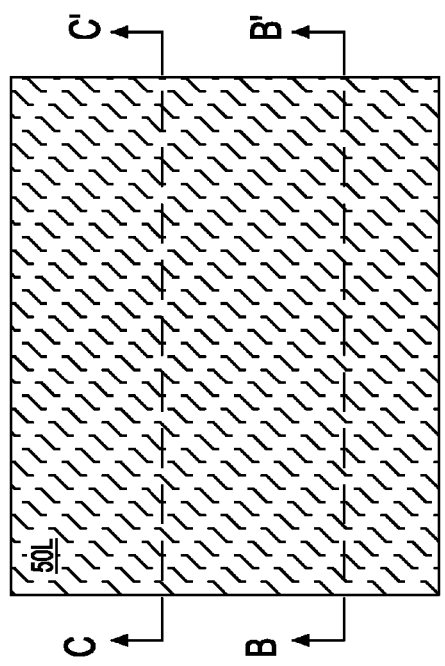
FIG. 7A is a top-down view of the first exemplary semiconductor structure of FIGS. 6A-6C after forming a gate spacer layer on exposed surfaces of the sacrificial dielectric portion, the dielectric liner, the semiconductor fins and the gate stack.
Figure 7C:
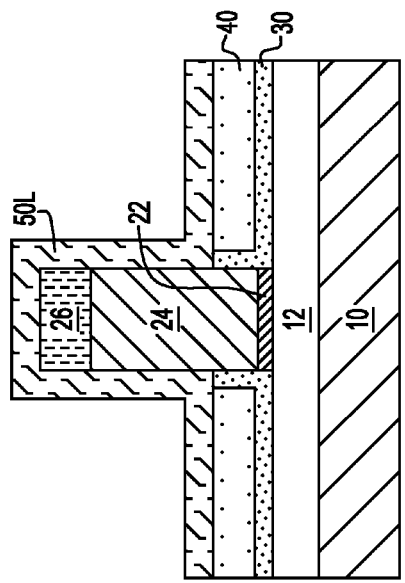
FIG. 7C is a cross-sectional view of the first exemplary semiconductor structure of FIG. 7A along line C-C'.
Figure 7B:
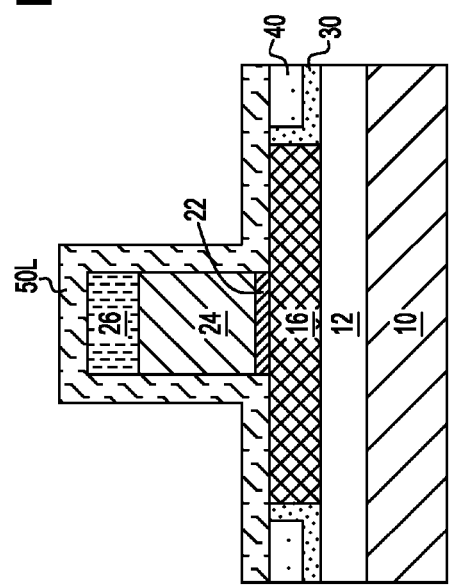
FIG. 7B is a cross-sectional view of the first exemplary semiconductor structure of FIG. 7A along line B-B'.

Referring to FIGS. 7A-7C, a gate spacer layer 50L is formed on exposed surfaces of the sacrificial dielectric portion 40, the dielectric liner 30, the semiconductor fins 16 and the gate stack (22, 24, 26) by conformally depositing a dielectric spacer material utilizing CVD or ALD. Exemplary dielectric spacer materials may include, but are not limited to, a dielectric nitride and a dielectric oxide. In one embodiment, the gate spacer layer 50L is made of silicon nitride. The thickness of the spacer layer 50L determines a width of a gate spacer subsequently formed. In the present application, since the spaces between semiconductor fins 16 are filled by the sacrificial dielectric portion 40, the gate spacer layer 50L is thus formed above the semiconductor fins 16. The thickness of the gate spacer layer 50L is thus limited by the spacing between adjacent gates (i.e., gate pitch), rather than the spacing between adjacent semiconductor fins 16 (i.e., the fin pitch). The width of the gate spacer can thus be optimized to enhance device performance. In one embodiment, the thickness of the gate spacer layer 50L can be from 5 nm to 50 nm, although lesser and greater thicknesses can also be employed.

Figure 8A:
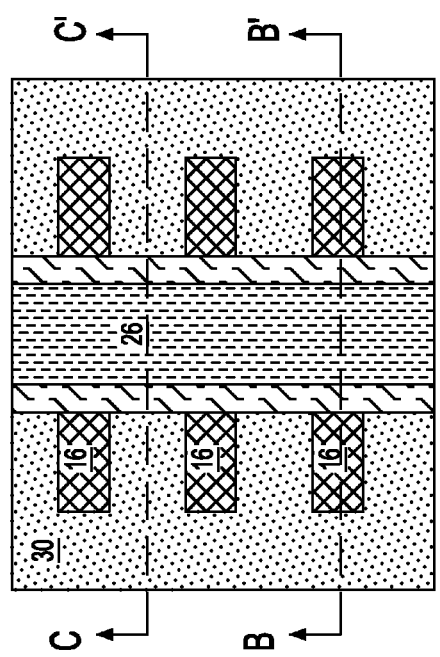
FIG. 8A is a top-down view of the first exemplary semiconductor structure of FIGS. 7A-7C after forming a gate spacer on sidewalls of an upper portion of the gate stack located above the semiconductor fins and removing the sacrificial dielectric portion to expose the dielectric liner.
Figure 8C:
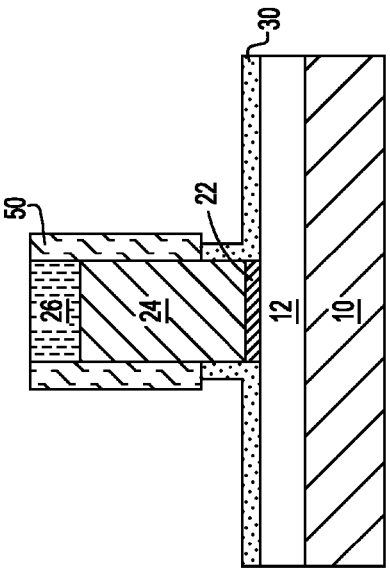
FIG. 8C is a cross-sectional view of the first exemplary semiconductor structure of FIG. 8A along line C-C'.
Figure 8B:
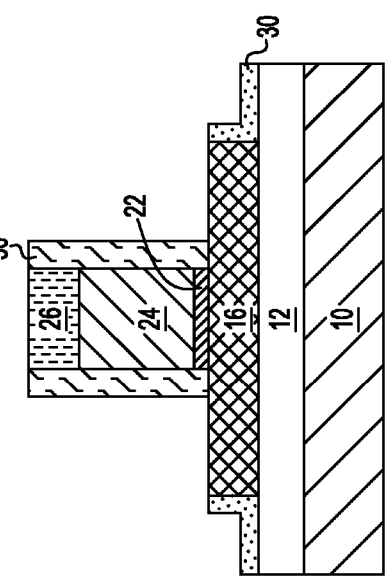
FIG. 8B is a cross-sectional view of the first exemplary semiconductor structure of FIG. 8A along line B-B'.

Referring to FIGS. 8A-8C, horizontal portions of the gate spacer layer 50L are removed, for example, by an anisotropic etch. The anisotropic etch can be a dry etch such as, for example, RIE or a wet etch that removes the dielectric material of the gate spacer layer 50L selective to the semiconductor material of the semiconductor fins 16 and the dielectric materials of the sacrificial dielectric portion 40, the dielectric liner 30 and the gate cap 26. Remaining vertical portions of the gate spacer layer 50L constitute a gate spacer 50. The gate spacer 50 laterally surrounds the upper portion of the gate stack (22, 24, 26) that is located above the semiconductor fins 16. In one embodiment, the gate spacer 50 has a bottom surface coplanar with the top surfaces of the semiconductor fins 16.

After forming the gate spacer 50, the sacrificial dielectric portion 40 is removed by a selective etching process that removes dielectric material of the sacrificial dielectric portion 40 selective to the semiconductor material of the semiconductor fins 16 and the dielectric materials of the dielectric liner 30, gate cap 26 and the gate spacer 50. For example, the sacrificial dielectric portion 40 may be removed by dry etch or a wet etch using DHF. The removal of the sacrificial dielectric portion 40 exposes the dielectric liner 30 present on the sidewalls of the semiconductor fins 16 and the top surface of the buried insulator layer 12.

Referring to FIGS. 9A-9C, the dielectric liner 30 is partially removed to expose sidewalls of the semiconductor fins 16 and the top surface of the buried insulator layer 12 utilizing the gate spacer 56 as an etch mask. An isotropic etch that removes the dielectric material of the dielectric liner 30 selective to the semiconductor material of the semiconductor fins 16 and the dielectric materials of the gate spacer 50, the buried insulator layer 20 and the gate spacer 50 is performed. The remaining portion of the dielectric liner 30 underneath the gate spacer 56 constitutes a gate liner 30G. In one embodiment, the outer sidewalls of the gate liner 30G are offset from the outer sidewalls of the gate spacer 50. Because dielectric liner 30 is quite thin, it can be completely removed from the sidewalls of the semiconductor fins 16 where epitaxial source and drain regions are to be formed, thus ensuring a uniform epitaxial growth of a semiconductor material on the sidewalls of the semiconductor fins 16.

Figure 10A:
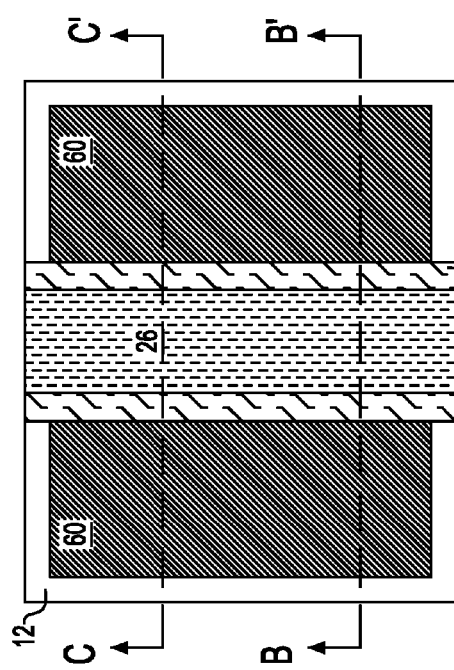
FIG. 10A is a top-down view of the first exemplary semiconductor structure of FIGS. 9A-9C after forming a source drain and a drain region over portions of the semiconductor fins located on opposite sides of a stack of the gate liner and the gate spacer.
Figure 10C:
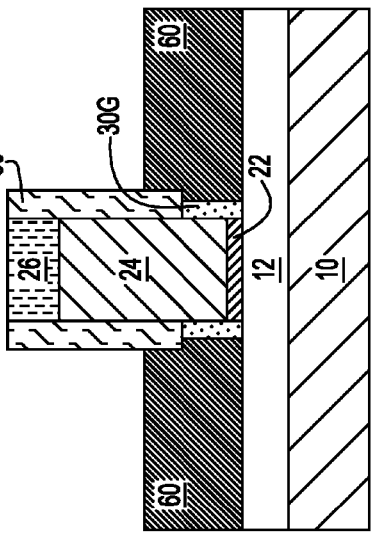
FIG. 10C is a cross sectional view of the first exemplary semiconductor structure of FIG. 10A along line C-C'
Figure 10B:
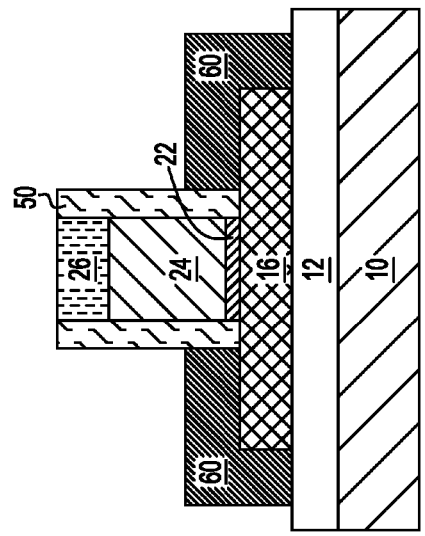
FIG. 10B is a cross sectional view of the first exemplary semiconductor structure of FIG. 10A along line B-B'.

Referring to FIGS. 10A-10C, a source region and a drain region (collectively referred to as source/drain regions 60) are formed on portions of the semiconductor fins 16 located on opposite sides of the assembly of gate stack (22, 24, 26) and a vertical stack of the gate liner 30G and the gate spacer 50. The source/drain regions 60 may be formed by a selective epitaxy process. During the selective epitaxy process, the semiconductor material grows only on exposed semiconductor surfaces, i.e., the top and sidewall surfaces of the semiconductor fins 16 and does not grow on dielectric surfaces, such as surfaces of the buried insulator layer 12, the gate cap 26, the gate spacer 50 and the gate liner 30G. The source/drain regions 60 are epitaxially aligned with the semiconductor fins 16 such that the source and drain regions 60 have the same crystalline orientation as the semiconductor fins 16. The source/drain regions 60 are doped with a dopant of p-type or n-type. The source/drain regions 60 can have a second conductivity opposite the first conductivity of the semiconductor fins 16 if the semiconductor fins 16 are doped. The doping of the source/drain regions 60 can be performed during deposition of the source/drain regions 60 by in-situ doping, or can be performed by ion implantation after deposition of the source/drain regions 60. The dopant in the source/drain regions 60 can be activated subsequently using a rapid thermal process.

In the present application, the complete removal of the gate liner 30G from sidewalls of the semiconductor fins 16 that are not covered by the gate spacer 50 enables a uniform epitaxial growth of the semiconductor material in formation of the source/drain regions 60. The source/drain regions 60 thus formed can have uniform thicknesses and uniform heights.

Figure 11A:
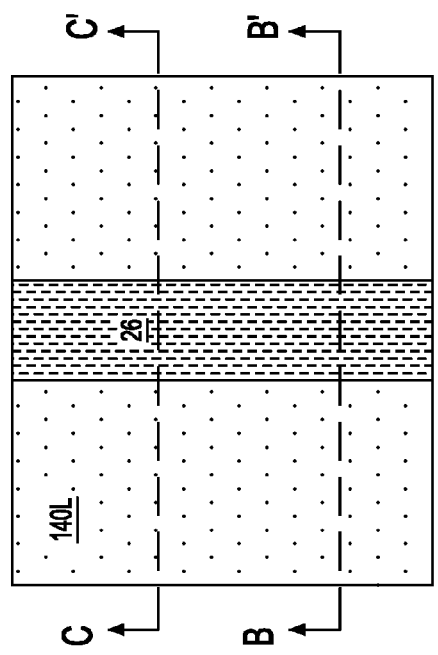
FIG. 11A is a top-down view of a second exemplary semiconductor structure of FIGS. 2A-2C after forming a sacrificial dielectric layer over exposed surfaces of the substrate, the semiconductor fins and the gate stack according to a second embodiment of the present application.
Figure 11C:
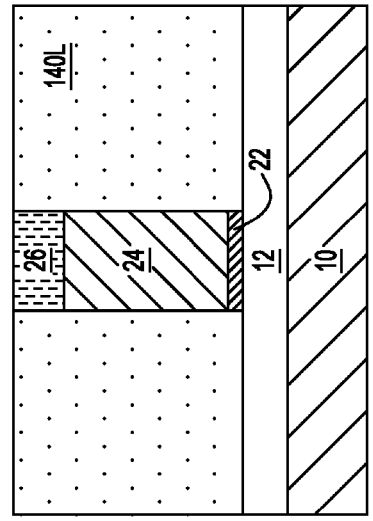
FIG. 11C is a cross-sectional view of the second exemplary semiconductor structure of FIG. 11A along line C-C'.
Figure 11B:
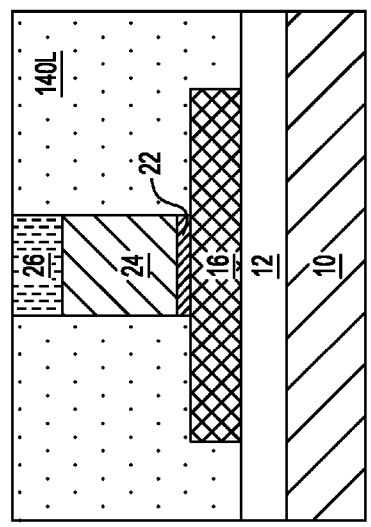
FIG. 11B is a cross-sectional view of the second exemplary semiconductor structure of FIG. 11A along line B-B'.

Referring to FIGS. 11A-11C, a second exemplary semiconductor structure of the present application according to a second embodiment of the present application can be derived from FIGS. 2A-2C after forming a sacrificial dielectric layer 140L over the buried insulator layer 12, the semiconductor fins 16 and the gate stack (22, 24, 26) and planarizing the sacrificial dielectric layer 140L to expose the topmost surface of the gate stack (22, 24, 26). The sacrificial dielectric layer 140L can be formed by performing the processing steps of FIGS. 4A and 4B.

Figure 12A:
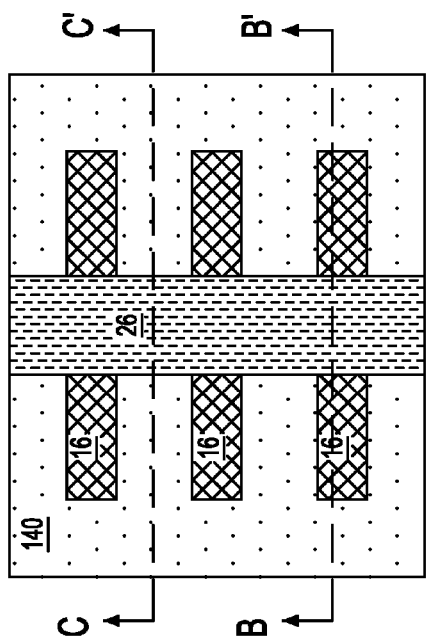
FIG. 12A is a top-down view of the second exemplary semiconductor structure of FIGS. 11A-11C after forming a sacrificial dielectric portion filling spaces between semiconductor fins.
Figure 12C:
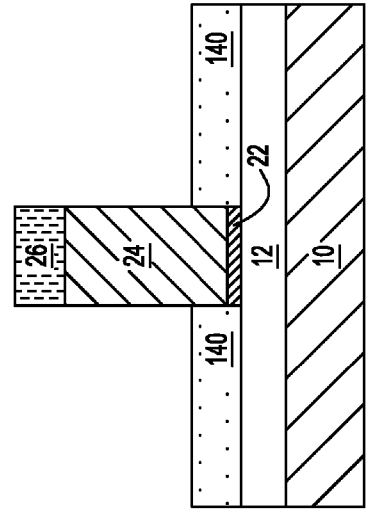
FIG. 12C is a cross-sectional view of the second exemplary semiconductor structure of FIG. 12A along line C-C'.
Figure 12B:
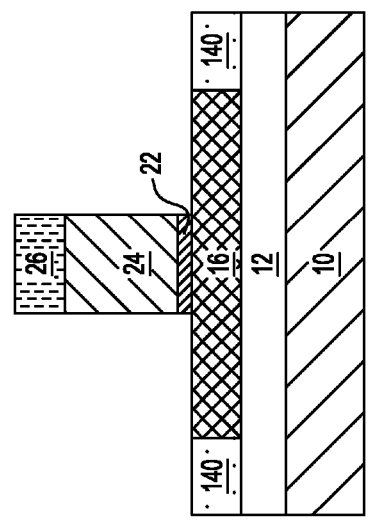
FIG. 12B is a cross-sectional view of the second exemplary semiconductor structure of FIG. 12A along line B-B'.

Referring to FIGS. 12A-12C, the sacrificial dielectric layer 140L is recessed by performing the processing steps of FIGS. 5A-5C to provide a sacrificial dielectric portion 140 filling spaces between the semiconductor fins 16. The sacrificial dielectric portion 140 has a top surface coplanar with the top surfaces of the semiconductor fins.

Figure 13A:
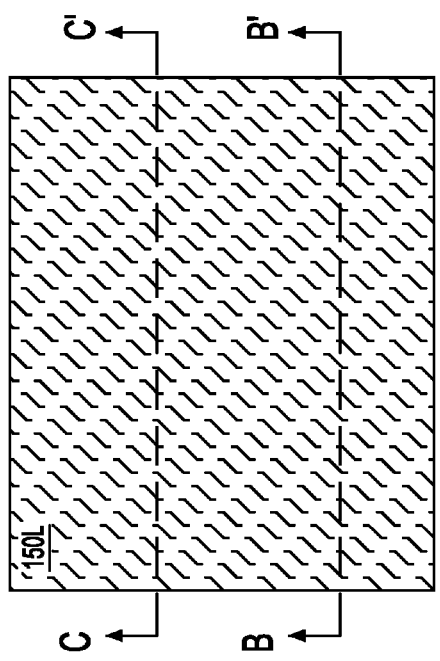
FIG. 13A is a top-down view of the second exemplary semiconductor structure of FIGS. 12A-12C after forming a gate spacer layer over exposed surfaces of the semiconductor fins, the sacrificial dielectric portion and the gate stack.
Figure 13C:
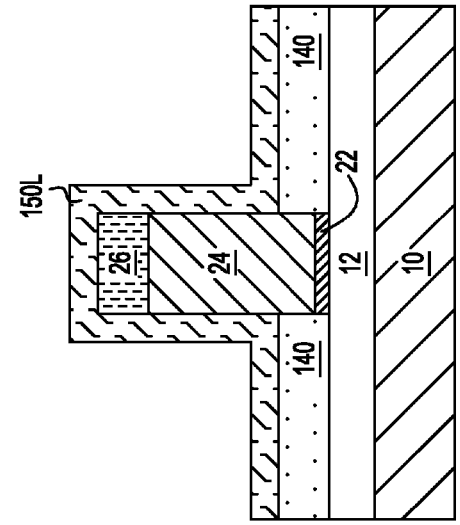
FIG. 13C is a cross-sectional view of the second exemplary semiconductor structure of FIG. 13A along line C-C'.
Figure 13B:
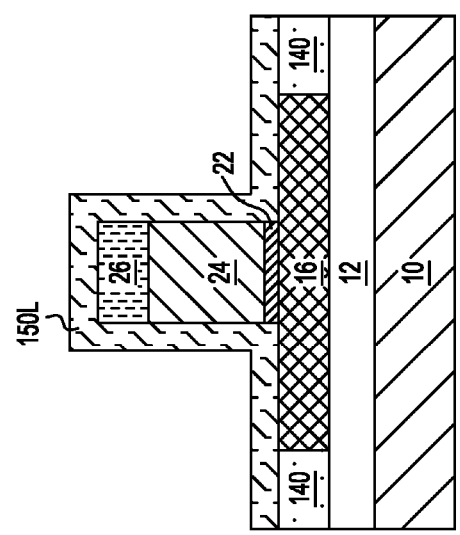
FIG. 13B is a cross-sectional view of the second exemplary semiconductor structure of FIG. 13A along line B-B'.

Referring to FIGS. 13A-13C, a gate spacer layer 150L is conformally deposited over exposed surfaces of the semiconductor fins 16, the gate stack (22, 24, 26) and the sacrificial dielectric portions 140 by performing the processing steps of FIGS. 7A-7C. The thickness of the gate spacer 150L thus is determined by the gate pitch, rather than the fin pitch.

Figure 14A:
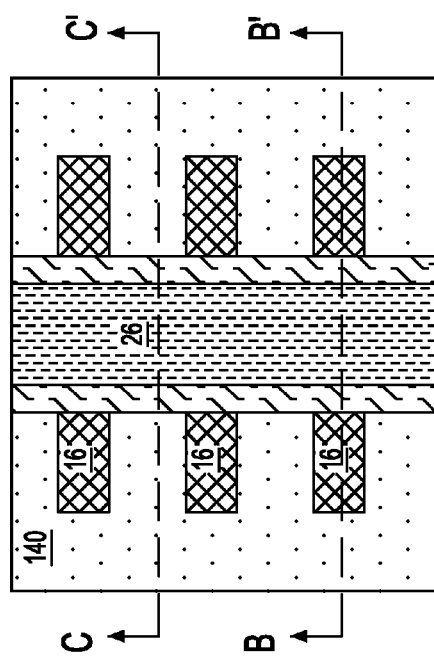
FIG. 14A is a top-down view of the second exemplary semiconductor structure of FIGS. 13A-13C after forming a gate spacer on sidewalls of an upper portion of the gate stack located above the semiconductor fins.
Figure 14C:
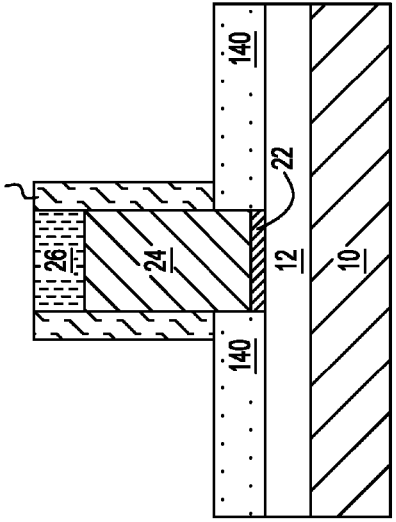
FIG. 14C is a cross-sectional view of the second exemplary semiconductor structure of FIG. 14A along line C-C'.
Figure 14B:
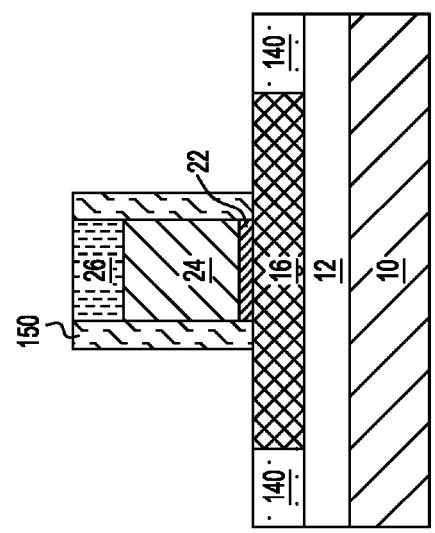
FIG. 14B is a cross-sectional view of the second exemplary semiconductor structure of FIG. 14A along line B-B'.

Referring to FIGS. 14A-14C, horizontal portions of the gate spacer layer 150L are removed by performing the processing steps of FIGS. 8A-8C to provide a gate spacer 150 laterally surrounding an upper portion of the gate stack (22, 24, 16) that is located above the semiconductor fins 16. The gate spacer 150 has a bottom surface coplanar with the top surfaces of the semiconductor fins 16.

Figure 15A:
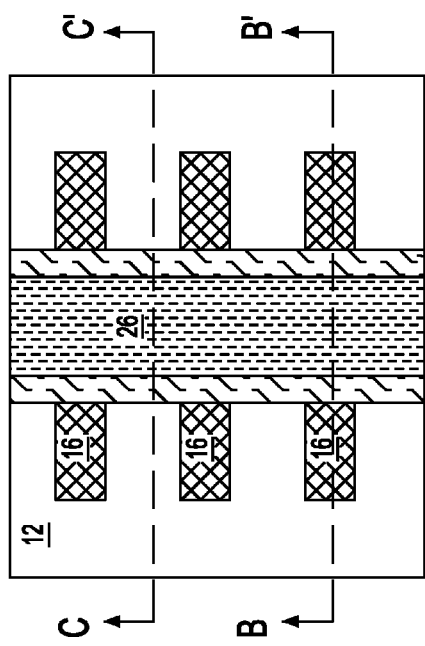
FIG. 15A is a top-down view of the second exemplary semiconductor structure of FIGS. 14A-14C after removing the sacrificial dielectric portion to expose sidewalls of the semiconductor fins.
Figure 15C:
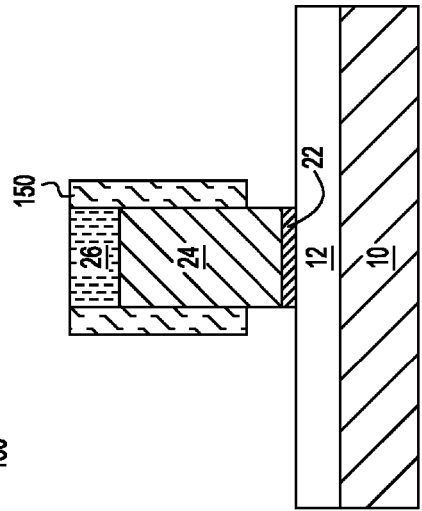
FIG. 15C is a cross-sectional view of the second exemplary semiconductor structure of FIG. 15A along line C-C'.
Figure 15B:
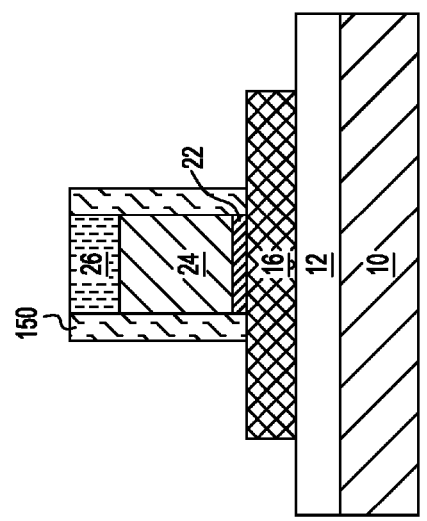
FIG. 15B is a cross-sectional view of the second exemplary semiconductor structure of FIG. 15A along line B-B'.

Referring to FIGS. 15A-15C, the sacrificial dielectric portion 140 is removed by performing the processing steps of FIGS. 8A-8C. The removal of the sacrificial dielectric portion 140 exposes the sidewalls of the semiconductor fins 16 and the sidewalls of a lower portion of the gate stack (22, 24, 26) contacting the semiconductor fins 16.

Referring to FIGS. 16A-16C, a dielectric liner layer 130L is formed on exposed surfaces of the buried insulator layer 12, the semiconductor fins 16, the gate stack (22, 24, 26) and the gate spacer 150 by performing processing steps of FIGS. 3A-3C.

Figure 17A:
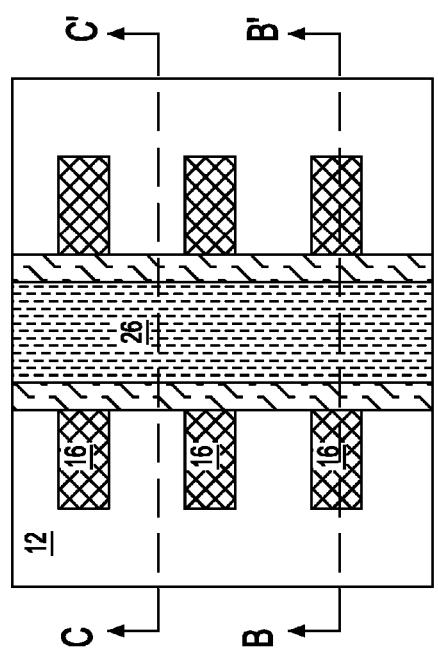
FIG. 17A is a top-down view of the second exemplary semiconductor structure of FIGS. 16A-16C after forming a gate liner underneath the gate spacer.
Figure 17C:
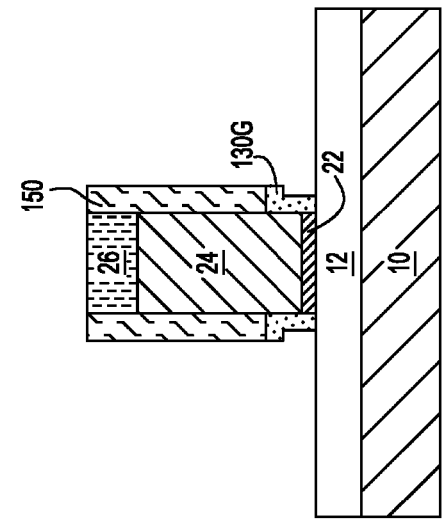
FIG. 17C is a cross-sectional view of the second exemplary semiconductor structure of FIG. 17A along line C-C'.
Figure 17B:
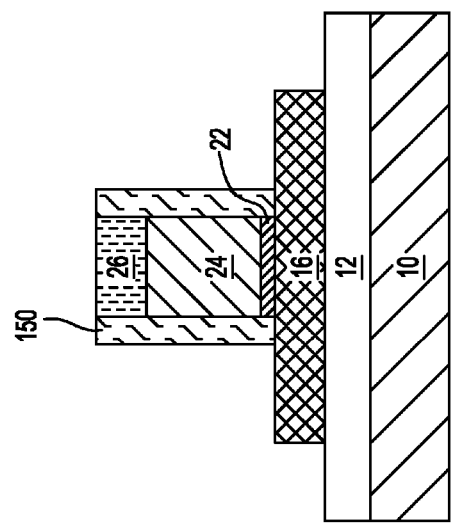
FIG. 17B is a cross-sectional view of the second exemplary semiconductor structure of FIG. 17A along line B-B'.

Referring to FIGS. 17A-17C, portions of the dielectric liner layer 130L that are not covered by the gate spacer 150 are removed by an isotropic etch in a manner similar to the processing steps of FIGS. 9A-9C. The remaining portion of the dielectric liner layer 130 underneath the gate spacer 150 constitutes a gate liner 130G. The gate liner 130G laterally surrounds the lower portion of the gate stack (22, 24, 26) and has a top surface coplanar with the top surfaces of the semiconductor fins 16.

Referring to FIGS. 18A-18C, source/drain regions 160 are formed on opposite sides of the assembly of the gate stack (22, 24, 25) and the vertical stack of the gate liner 130G and the gate spacer 150 by performing processing steps of FIGS. 10A-10C. The source/drain regions 160 that are formed have uniform thicknesses and uniform heights.

While the present application has been particularly shown and described with respect to various embodiments thereof, it will be understood by those skilled in the art that the foregoing and other changes in forms and details may be made without departing from the spirit and scope of the present application. It is therefore intended that the present not be limited to the exact forms and details described and illustrated, but fall within the scope of the appended claims.

What is claimed is:

1. A method of forming a semiconductor structure comprising:

forming a gate stack over a portion of each of a plurality of semiconductor fins located on a substrate;

forming a dielectric liner layer over exposed surfaces of the gate stack, the plurality of semiconductor fins and the substrate;

forming a sacrificial dielectric portion filling spaces between the plurality of semiconductor fins;

removing a portion of the dielectric liner layer from an upper portion of the gate stack that is located above the plurality of semiconductor fins to provide a dielectric liner, the dielectric liner laterally surrounding a lower portion of the gate stack that contacts the plurality of the semiconductor fins;

forming a gate spacer laterally surrounding an upper portion of the gate stack that is located above the plurality of the semiconductor fins;

removing the sacrificial dielectric portion; and removing portions of the dielectric liner that are not covered by the gate spacer from sidewalls of the plurality of semiconductor fins and a top surface of the substrate.

2. The method of claim 1, wherein the forming the sacrificial dielectric portion comprises:

forming a sacrificial dielectric layer over the dielectric liner layer;

planarizing the sacrificial dielectric layer to expose a topmost surface of the dielectric liner layer located atop the gate stack; and recessing the sacrificial dielectric layer to provide the sacrificial dielectric portion employing the dielectric liner layer as an etch stop.

3. The method of claim 1, wherein the forming the gate spacer comprises:

conformally depositing a gate spacer layer on the sacrificial dielectric portion, the dielectric liner, the plurality of semiconductor fins and the upper portion of the gate stack; and removing horizontal portions of the gate spacer layer by an anisotropic etch.

4. The method of claim 3, wherein the gate spacer layer has a thickness greater than a thickness of the dielectric liner layer.

5. The method of claim 1, further comprising forming a source region and a drain region on portions of the semiconductor fins that are not covered by the gate stack, the gate spacer and a remaining portion of the dielectric liner.

6. A method of forming a semiconductor structure comprising:

forming a gate stack over a portion of each of a plurality of semiconductor fins located on a substrate;

forming a sacrificial dielectric portion filling spaces between the plurality of semiconductor fins, the sacrificial dielectric portion laterally surrounding a lower portion of the gate stack;

forming a gate spacer on sidewalls of an upper portion of the gate stack that is not covered by the sacrificial dielectric portion;

removing the sacrificial dielectric portion to expose sidewalls of the lower portion of the gate stack; and forming a gate liner on the exposed sidewalls of the lower portion of the gate stack.

7. The method of claim 6, wherein the sacrificial dielectric portion has a top surface coplanar with top surfaces of the plurality of semiconductor fins.

8. The method of claim 6, wherein the gate spacer has a bottom surface coplanar with top surfaces of the plurality of semiconductor fins.

9. The method of claim 6, wherein the forming the gate liner on the exposed sidewalls of the lower portion of the gate stack comprises:

forming a dielectric liner layer on exposed surfaces of the plurality of semiconductor fins, the gate spacer, the gate stack and the substrate; and removing portions of the dielectric liner layer that are not covered by the gate spacer.

10. The method of claim 6, wherein the gate spacer has a width greater than a width of the gate liner.

* * * * *